United States Patent [19]
Ikawa et al.

[11] Patent Number: 4,907,200
[45] Date of Patent: Mar. 6, 1990

[54] DYNAMIC MEMORY

[75] Inventors: Tatsuo Ikawa, Mitaka; Katsushi Nagaba, Kawasaki, both of Japan

[73] Assignee: Kabushiki Kaisha Toshiba, Kawasaki, Japan

[21] Appl. No.: 264,246

[22] Filed: Oct. 27, 1988

[30] Foreign Application Priority Data

Oct. 31, 1987 [JP] Japan .................................. 62-276261

[51] Int. Cl.$^4$ ........................ G11C 7/00; G11C 11/40
[52] U.S. Cl. ................. 365/189.09; 365/206; 365/210; 365/203
[58] Field of Search .............. 365/203, 189.09, 189.01, 365/206–207, 208, 210, 230.06

[56] References Cited

U.S. PATENT DOCUMENTS 4,409,679 10/1983 Kurafuji et al. ..................... 365/227
4,740,926 4/1988 Takemae et al. .................... 365/203

OTHER PUBLICATIONS

"A 1 Mb CMOS DRAM with Fast Page and Static Column Modes", 1985 IEEE International Solid-State Circuits Conference, Session XVII Megabit DRAMs, Feb. 15, 1985, Saito et al., pp. 252–253.

Primary Examiner—Stuart N. Hecker
Assistant Examiner—Alyssa H. Bowler
Attorney, Agent, or Firm—Finnegan, Henderson, Farabow, Garrett and Dunner

[57] ABSTRACT

A dynamic memory having pairs of bit lines. A sense amplifier is connected between each pair of bit lines for detecting data from the potential difference between these bit lines. The memory further comprises first and second pair of dummy word lines. A capacitor is coupled between the first of each pair of bit lines, on the one hand, and the first pair of dummy word lines, on the other. Similarly, a capacitor is coupled between the second of each pair of bit lines, on the one hand, and the second pair of dummy word lines, on the other. A first dummy word line driver is connected to the first pair of dummy word lines, for generating a reference potential in the first of each pair of bit lines. A second dummy word line driver is connected to the second pair of dummy word lines, for generating a reference potential in the second of each pair of bit lines. The memory also has a selection circuit for selecting either the first or second dummy word line driver. During a precharging period, either dummy word line driver sets both pairs of dummy word lines at a precharging potential. During a data-reading period, the dummy word line driver selected by the selection circuit sets the dummy word lines at a high potential and a low potential, respectively, and the dummy word line driver selected by the selection circuit sets both dummy word lines at a precharging potential.

17 Claims, 5 Drawing Sheets

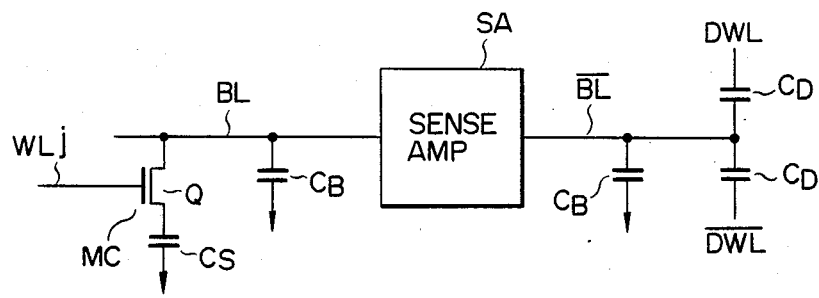
F I G. 1
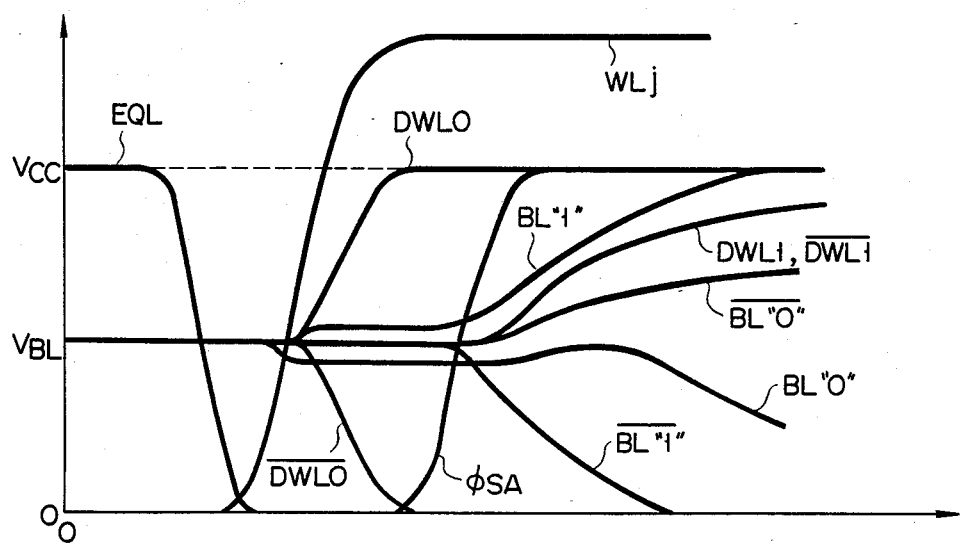
F I G. 3

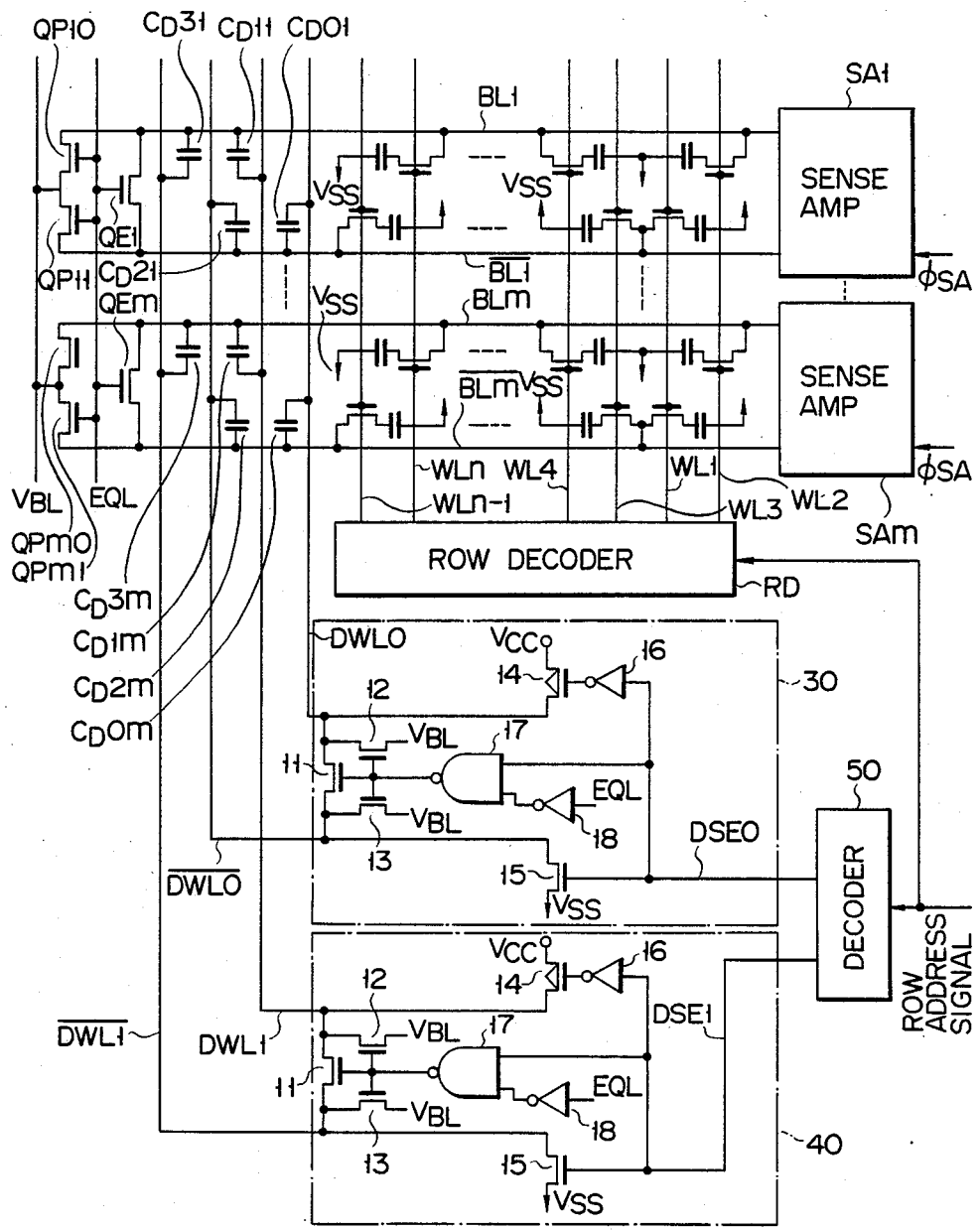
F I G. 5

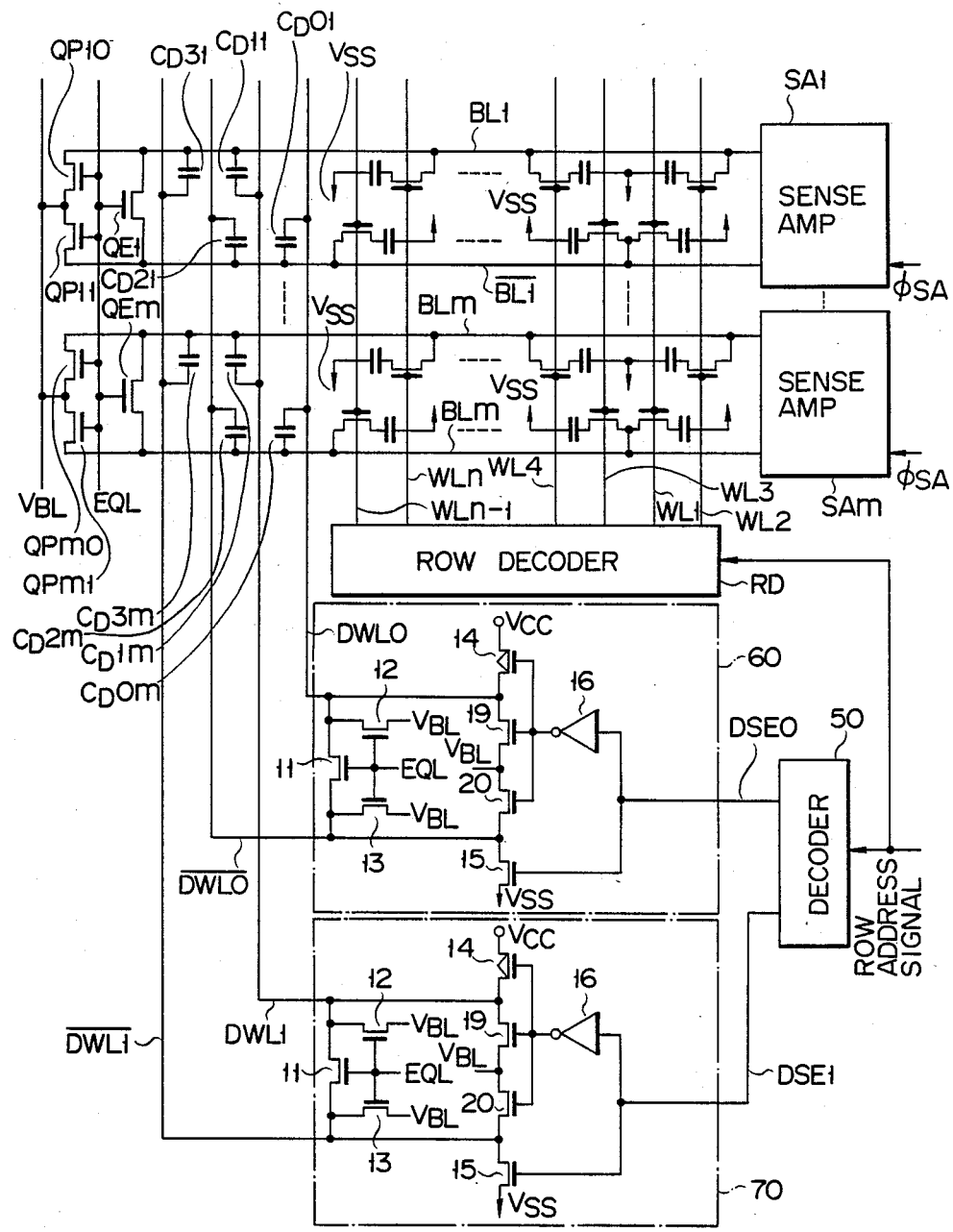
F I G. 7

DYNAMIC MEMORY

BACKGROUND OF THE INVENTION

1. Field of the Invention

The present invention relates to a dynamic memory comprising a plurality of memory cells, each consisting of a selecting transistor and a data-storing capacitor.

2. Description of the Related Art

For a semiconductor memory it is most important that data be stably read from, and stably written into, the memory. For a dynamic memory whose memory cells each comprise one selecting transistor and one data-storing capacitor, it is very important to maintain a reference potential constant, which is compared with the potential of a bit line, thereby to detect data. Unless the reference potential is stable, the read-out margin of the memory cannot be sufficient. (Note: the greater the read-out margin, the smaller the change in the bit-line potential, from which data can be detected.)

It will be explained how to generate a reference potential in a 1 MB DRAM. In the case of this memory having a great memory capacity, an extremely large number of memory cells are connected to each bit line, and the parasitic capacitance $C_B$ of the bit line is naturally very great. On the other hand, there is the trend that the capacitance $C_S$ of the data-storing capacitor of each memory cell is inversely proportional to the memory capacity of the entire memory.

The voltage V0 detected from a memory cell storing logic "0" (i.e., the ground potential) and the potential $V_{BL}$ which the bit line connected to this cell has before the reading of logic "0" have the following relationship:

$$C_B \cdot V_{BL} = (C_B + C_S) \cdot V0 \tag{1}$$

Therefore, V0 can be given as follows:

$$V0 = \frac{C_B}{C_B + C_S} \cdot V_{BL} \tag{2}$$

The voltage V1 detected from a memory cell storing logic "1" (i.e., the $V_{CC}$ potential) and the potential $V_{BL}$ which the bit line connected to this cell has before the reading of logic "1" have the following relationship:

$$C_B \cdot V_{BL} + C_S \cdot V_{CC} = (C_B + C_S) \cdot V1 \tag{3}$$

Therefore, V1 can be given as follows:

$$V1 = \frac{C_B \cdot V_{BL} + C_S \cdot V_{CC}}{C_B + C_S} \tag{4}$$

It is desirable that the reference potential be exactly between V0 and V1, i.e., (V0+V1)/2. To generate a reference potential of this value, the circuit shown in FIG. 1 may be used in a DRAM. The DRAM has a pair of bit lines BL and $\overline{BL}$. Memory cell MC is coupled to bit line BL. Cell MC comprised of selecting transistor Q and data-storing capacitor $C_S$. Transistor Q is to be driven by a signal on word line WLj. Two capacitors $C_D$ are connected at one end to bit line $\overline{BL}$. Parasitic capacitor $C_B$ is connected to both bit lines BL and $\overline{BL}$. One of capacitors $C_D$ connected to bit line $\overline{BL}$ is coupled at the other end to dummy word line $\overline{DWL}$. The other capacitor $C_D$ connected to bit line $\overline{BL}$ is coupled at the other end to dummy word line $\overline{DWL}$. Latch-type sense amplifier SA is connected between bit lines BL and $\overline{BL}$.

To read data from memory cell MC, both bit lines BL and $\overline{BL}$ are precharged to a predetermined DC potential $V_{BL}$ by a precharging means (not shown). While the bit lines are being precharged, both dummy word lines DWL and $\overline{DWL}$ are connected to a $V_{BL}$ potential source and thus are set at potential $V_{BL}$. After bit lines BL and $\overline{BL}$ have been precharged to potential $V_{BL}$, both dummy word lines are disconnected from the $V_{BL}$ potential source. Then, dummy word lines DWL and $\overline{DWL}$ are connected to the $V_{CC}$ potential source and the $V_{SS}$ potential source, respectively. As a result of this, capacitors $C_D$ are first charged and then discharged. Assuming that the potential of bit line $\overline{BL}$ changes to Vref after capacitors $C_D$ have been charged and discharged, the potential Vref, the capacitance $C_B$ of capacitors $C_B$, the capacitances $C_D$, and the potential $V_{CC}$ have the following relationship:

$$C_B \cdot V_{BL} = C_D \cdot \text{Vref} - C_D \cdot (V_{CC} - \text{Vref}) + C_B \cdot \text{Vref} \tag{5}$$

As can be understood from equation (5), potential Vref is given as:

$$\text{Vref} = \frac{C_B \cdot V_{BL} + C_D \cdot V_{CC}}{2C_D + C_B} \tag{6}$$

If $C_D = \frac{1}{2} C_S$, equation (6) can be transformed to the following:

$$\text{Vref} = \frac{1}{2} \left( \frac{C_B \cdot V_{BL}}{C_B + C_S} + \frac{C_B \cdot V_{BL} + C_S \cdot V_{CC}}{C_B + C_S} \right) \tag{7}$$
$$= \frac{1}{2}(V0 + V1)$$

As is evident from equation (7), the potential exactly half the readout potential of memory cell MC can be generated and used as reference potential Vref, whatever potential bit line $\overline{BL}$ has before data is read out from memory cell MC. After reference potential Vref has been generated, sense amplifier SA detects the data stored in memory cell MC by comparing voltage V1 or V0 with reference voltage Vref.

FIG. 2 is a circuit diagram showing a conventional DRAM having means for a reference potential based on the principle described above. As is illustrated in this figure, the DRAM comprises pairs of bit lines BL1, $\overline{BL1}$, ... BLm, $\overline{BLm}$, memory cells MC, word lines WL1, ... WLn-1 and WLn, a pair of dummy word lines DWL0 and $\overline{DWL0}$, and a pair of dummy word lines DWL1 and $\overline{DWL1}$. The DRAM further comprises transistors QE1 to QEm, transistors QP10, QP11 to QPm0, PQm1, latch-type sense amplifiers SA1 to SAm, row decoder RD, dummy word line drive circuits 10 and 20, capacitors $C_D01$, $C_D21$, ... $C_D0m$, and $C_D2m$, and capacitors $C_D11$, $C_D31$, ... $C_D1m$, and $C_D3m$.

Each memory cell is comprised of a selecting transistor Q and a data-storing capacitor $C_S$. Transistors QE1 to QEm are used to short-circuit the bit line pairs in response to an equalizing signal EQL. Transistors QP10, QP11 to QPm1, and PQm1 are used to set the bit line pairs at potential $V_{BL}$ in response to the equalizing signal EQL. Latch-type sense amplifiers SA1 to SAm are designed to detect data from the bit line pairs in response to a control signal φSA. Row decoder RD is used to drive word lines WL1, ... WLn-1, and WLn. Circuit 10 is designed to drive dummy word lines DWL0 and $\overline{DWL0}$, and circuit 20 to drive dummy word lines DWL1 and $\overline{DWL1}$. Capacitors $C_D01$, $C_D21$, ... $C_D0m$, and $C_D2m$ are equivalent to one of two capacitors $C_D$ shown in FIG. 1, and each is connected a bit line $\overline{BL}$ and dummy word line DWL0 for generating a reference potential in bit line $\overline{BL}$. Capacitors $C_D11$, $C_D31$, ... $C_D1m$, and $C_D3m$ are equivalent to the other capacitor $C_D$ shown in FIG. 1, and each is connected a bit line BL and dummy word line DWL0 for generating a reference potential in bit line BL.

Dummy word line drive circuit 10 comprises transistor 11 for short-circuiting dummy word lines DWL0 and $\overline{DWL0}$ in response to equalizing signal EQL, transistors 12 and 13 for connecting lines DWL0 and $\overline{DWL0}$ to potential source $V_{BL}$ in response to signal EQL, P-channel transistor 14 for connecting dummy word line DWL0 to potential source $V_{CC}$ in response to selection signal DSE0, and transistor 15 for connecting dummy word line $\overline{DWL0}$ to potential source $V_{SS}$ in response to signal DSE0.

As can be understood from FIG. 2, dummy word line drive circuit 20 is identical in structure to dummy word line drive circuit 10. It is different in the function of its elements. More specifically, transistor 11 short-circuits dummy word lines DWL1 and $\overline{DWL1}$ in response to signal EQL; transistors 12 and 13 connect lines DWL1 and $\overline{DWL1}$ to potential source $V_{BL}$ in response to signal EQL; P-channel transistor 14 couples dummy word line DWL1 to potential source $V_{CC}$ in response to selection signal DSE1; and transistor 15 connects dummy word line $\overline{DWL1}$ to potential source $V_{SS}$ in response to signal DSE1.

Selection signals DSE0 and DSE1, which are used in dummy word line drive circuits 10 and 20, respectively, are selectively set at logic "1" level in accordance with a row-address signal (not shown) which is identical to the one supplied to row decoder RD. All transistors used in either dummy word line drive circuit, except for P-channel transistor 14, are of N-channel type.

Assuming that the memory cells connected to bit line BL of each pair have been selected, then bit line BL and $\overline{BL}$ of the pair are defined as bit lines BL "1" and $\overline{BL}$"1", respectively when the selected cells store logic "1", and as bit lines BL "0" and $\overline{BL}$"0", respectively, when the memory cells store logic "0".

Equalizing signal EQL falls from the $V_{CC}$ level to the $V_{SS}$ (0V) as is shown in FIG. 3. On the other hand, the potential of a word line WLj (j=1 to n) rises from the $V_{SS}$ level to the $3/2 V_{CC}$ level. Along with the rise of the potential of word line WLj, selection signal DSE0 rises from the $V_{SS}$ level to the $V_{CC}$ level. Hence, as is shown in FIG. 3, the potential of dummy word line DWL0 rises from the $V_{BL}$ level to the $V_{CC}$ level, whereas the potential of dummy word line $\overline{DWL0}$ falls from the $V_{BL}$ level to the $V_{SS}$ level. As a result of this, a reference potential is generated in bit lines $\overline{BL1}$ to $\overline{BLm}$, as may be understood from the description of the circuit shown in FIG. 1. At this time, dummy word lines DWL1 and $\overline{DWL1}$ of the other pair are in a "floating" state. Here it is assumed that, of the memory cells simultaneously selected by word line WLj, m cells store logic "0" and n cells store logic "1", where m<<n.

After data items have been read from the selected memory cells to bit lines BL1 to BLm, signal φSA enables sense amplifiers SA1 to SAm to detect data from bit lines BL1 to BLm. Hence, sense amplifiers SA1 to SAm start detecting the data. Thereafter, the potentials of bit lines BL"1" and bit lines $\overline{BL}$"0" rise to the $V_{CC}$ level, whereas the potentials of bit lines BL"0" and bit lines $\overline{BL}$"1" fall to the $V_{SS}$ level. Since dummy word lines DWL1 and $\overline{DWL1}$ are in the floating state, their potentials change in the same way as the potential of each bit line BL"1" and the potential of each bit line BL"0", respectively.

The electric charge Q0 accumulated in dummy word line DWL1 or $\overline{DWL1}$ before sense amplifiers SA1 to SAm start detecting data is given as follows:

$$Q0 = C_{DWL} \cdot V_{BL} \tag{8}$$

where $C_{DWL}$ is the parasitic capacitance of the pair of dummy word lines DWL1 and $\overline{DWL1}$.

Assuming that upon lapse of Δt seconds after the sense amplifiers have started detecting data, the potentials of bit lines BL"0" and BL"1" change to $V_{BL}+V_L$ and $V_{BL}+V_H$, respectively, then the electric charge QΔt is accumulated in dummy word line DWL1 or $\overline{DWL1}$. This electric charge QΔt is presented as follows:

$$Q\Delta t = C_{DWL} \cdot (V_{BL} + \Delta V_{DWL}) - \tag{9}$$

$$nC_D \cdot \{(V_{BL} + \Delta V_H) - (V_{BL} + \Delta V_{DWL})\} +$$

$$mC_D \cdot \{(V_{BL} + \Delta V_{DWL}) - (V_{BL} - \Delta V_H)\}$$

Since m<<n, the third term of equation (9) has a value far smaller than that of the second term and is negligible. Further, the electric charge accumulated in dummy word line DWL1 or $\overline{DWL1}$ either before or after the start of the data reading is retained. Therefore:

$$C_{DWL} \cdot V_{BL} = C_{DWL} \cdot (V_{BL} + \Delta V_{DWL}) - \tag{10}$$

$$nC_D \cdot (V_{BL} + \Delta V_{DWL})$$

From equation (10), we obtained:

$$\Delta V_{DWL} = \frac{n \cdot C_D}{C_{DWL} + nC_D} \cdot \Delta V_H \tag{11}$$

If n=500, $C_D$=20pF, $C_{DWL}$=3pF, $V_H$=0.3 V, then $V_{DWL}$ is 230 mV. Hence, the potential of each bit line BL"0", through which logic "0" is read form the memory cells storing logic "0", rises and stays at a high level for some time, as is illustrated in FIG. 3. Immediately after the start of the data reading, the potential difference between the bit lines of any pair is small, and the data detected and latched by the sense amplifier connected to these bit lines is likely to be inverted by noise. A rise of the potential of bit line BL"0" reduces the potential difference between bit lines BL"0" and $\overline{BL}$"0", inevitably increasing the possibility that the data detected and latched by the sense amplifier is inverted. In the worst case, the potential of bit line BL"0" rises above that of bit line $\overline{BL}$"0" immediately after the start of the data reading, whereby the sense amplifier makes an error, thus reducing the reliability of the data-reading.

The data detected and latched by the sense amplifier may be inverted when m>>n, that is, when more memory cells store logic "0" than those storing logic "1", as will be understood from FIG. 4 which shows how the potentials of the various lines change with time when m>>n. Since dummy word lines DWL1 and $\overline{DWL1}$ are in the floating state when logic "1" are read from n memory cells through bit lines BL"1" and $\overline{BL}$"1", the potentials of lines DWL1 and $\overline{DWL1}$ in the same way as those of bit lines BL"1" and $\overline{BL}$"1", respectively. Also in this case, the potential difference between the bit lines of any pair is small immediately after the start of the data reading. In the worst case, the potential of bit line BL"1" falls below that of bit line $\overline{BL}$"1" immediately after the start of the data reading, whereby the sense amplifier make an error, thus reducing the reliability of the data-reading.

SUMMARY OF THE INVENTION

The object of the present invention is to provide a reliable dynamic memory wherein sense amplifiers correctly detect data during the initial phase of data reading.

According to the present invention, there is provided a dynamic memory comprising a plurality of pairs of bit lines, a plurality of memory cells connected to the pairs of bit lines, a plurality of word lines for selecting the memory cells, a precharging-potential source for precharging the bit lines, a high-potential source, and a low-potential source. The bit lines are precharged by means of the precharging-potential source to read data from the memory cells. The dynamic memory further comprises a plurality of sense amplifiers, first and second pair of dummy word lines, a plurality of first capacitors, a plurality of second capacitors, a first dummy word drive circuit, a second dummy word drive circuit, and a selection circuit. Each sense amplifier is coupled between a pair of bit lines for detecting data from the potential difference between the bit lines. Each first capacitor is connected to the first pair of dummy word lines and also to the first of a pair of bit lines, for generating a first reference potential. Each second capacitor is connected to the second pair of dummy word lines and also to the second of the pair of bit lines, for generating a reference potential. The first dummy word line drive circuit is connected to the first pair of dummy word lines, for generating a third reference potential in the first of each pair of bit lines. The second dummy word line drive circuit is connected to the second pair of dummy word lines, for generating the a fourth reference potential in the second of each pair of bit lines. The selection circuit is designed to select either the first dummy word line drive circuit or the second dummy word line drive circuit.

While the bit lines are being precharged, the first dummy word line drive circuit sets the first pair of dummy word lines at the potential of the precharging-potential source, and the second dummy word line drive circuit sets the second pair of dummy word lines at the potential of the precharging-potential source. While the data is being read from memory cells, the dummy word line drive circuit selected by the selection circuit sets one of the pairs of dummy word lines at the potential of the high-potential source, and the dummy word line drive circuit not selected by the selection circuit sets the other pair of dummy word lines at the potential of the low-potential source.

BRIEF DESCRIPTION OF THE DRAWINGS

FIG. 1 is a diagram showing the circuit used in a conventional dynamic memory, for generating a reference potential;

FIG. 3 is a diagram showing how the potentials of the various lines used in the conventional dynamic memory change with time when more memory cells store logic "1" than logic "0";

FIG. 5 is a circuit diagram showing a dynamic memory according to the present invention;

FIG. 7 is a circuit diagram illustrating another dynamic memory according to the present invention.

DETAILED DESCRIPTION OF THE PREFERRED EMBODIMENTS

Figure 2:
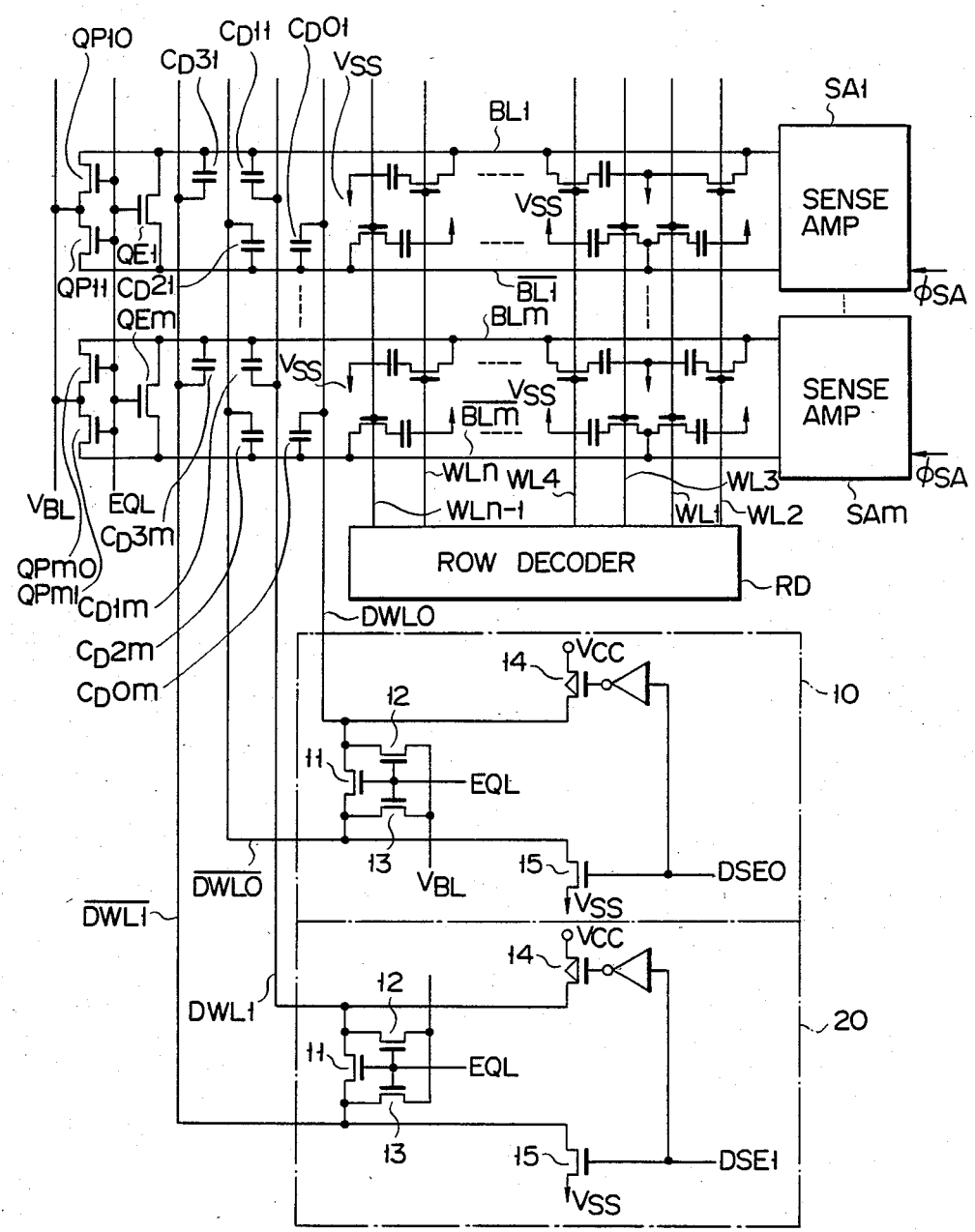
FIG. 2 is a circuit diagram showing a conventional dynamic memory.
Figure 4:
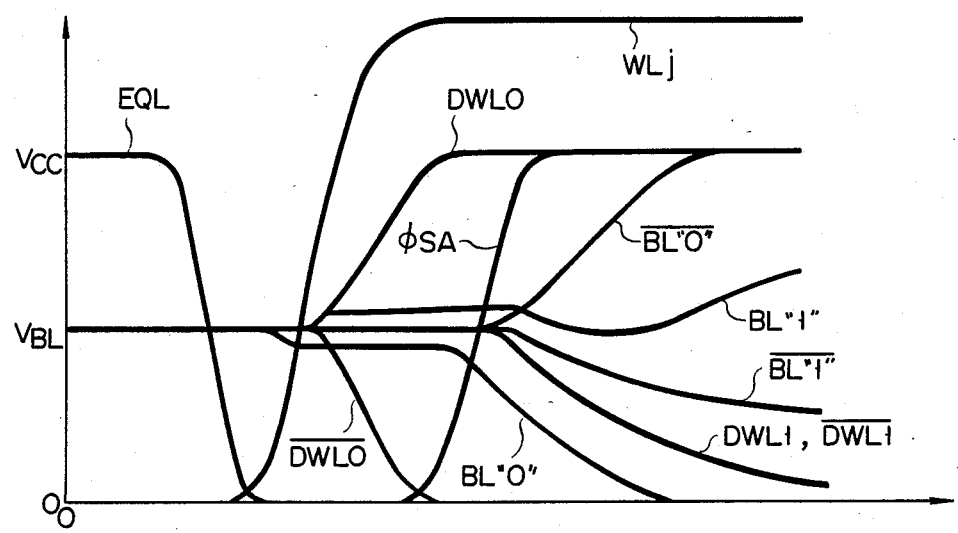
FIG. 4 is a diagram showing how the potentials of the various lines used in the conventional dynamic memory change with time when more memory cells store logic "0" than logic "1"

A dynamic memory according to the invention will now be described, with reference to FIG. 5.

As is shown in FIG. 5, the dynamic memory comprises pairs of bit lines BL1, $\overline{BL1}$, ... BLm, $\overline{BLm}$, memory cells MC, word lines WL1, ... WLn-1 and WLn, a pair of dummy word lines DWL0 and $\overline{DWL0}$, and a pair of dummy word lines DWL1 and $\overline{DWL1}$. The DRAM further comprises transistors QE1 to QEm, transistors QP10, QP11 to QPm0, QPm1, latch-type sense amplifiers SA1 to SAm, row decoder RD, dummy word line drivers 30 and 40, capacitors $C_D01$, $C_D21$, ... $C_D0m$, and $C_D2m$, and capacitors $C_D11$, $C_D31$, ... $C_D1m$, and $C_D3m$.

Each memory cell each is comprised of a selecting transistor and a data-storing capacitor. Transistors QE1 to QEm are used to short-circuit the bit line pairs in response to an equalizing signal EQL. Transistors QP10, QP11 to QPm0, and QPm1 are used to set the bit line pairs at potential $V_{BL}$ in response to the equalizing signal EQL. Latch-type sense amplifiers SA1 to SAm are designed to detect data from the bit line pairs in response to a control signal $\phi SA$. Row decoder RD is used to drive word lines WL1, ... WLn-1, and WLn. Circuit 30 is designed to drive dummy word lines DWL0 and $\overline{DWL0}$, and circuit 40 to drive dummy word lines DWL1 and $\overline{DWL1}$. Capacitors $C_D01$, $C_D21$, ... $C_D0m$, and $C_D2m$ are equivalent to one of two capacitors $C_D$ shown in FIG. 1, and each is connected a bit line $\overline{BL}$ and dummy word line DWL0 for generating a reference potential in bit line $\overline{BL}$. Capacitors $C_D11$, $C_D31$, ... $C_D1m$, and $C_D3m$ are equivalent to the other capacitor $C_D$ shown in FIG. 1, and each is connected a bit line BL and dummy word line DWL1 for generating a reference potential in bit line BL.

Dummy word line driver 30, which is connected to dummy word lines DWL0 and $\overline{DWL0}$, sets these dummy word lines at a potential in response to the equalizing signal EQL and selection signal DSE0. Dummy word line driver 40, which is connected to dummy word lines DWL1 and $\overline{DWL1}$, sets these dummy word lines at a potential in response to the equalizing signal EQL and selection signal DSE1.

Dummy word line driver 30 comprises MOS transistor 11 connected between dummy word lines DWL0 and $\overline{\text{DWL0}}$, MOS transistor 12 coupled between dummy word line DWL0 and a $V_{BL}$ power source, MOS transistor 13 coupled between dummy word line $\overline{\text{DWL0}}$ and a $V_{BL}$ power source, P-channel MOS transistor 14 connected between a $V_{CC}$ potential source and dummy word line DWL0, MOS transistor 15 connected between $V_{SS}$ (ground) potential source and dummy word line $\overline{\text{DWL0}}$, inverter 16 connected to receive selection signal DSE0, two-input NAND gate 17 and inverter 18 connected to receive equalizing signal EQL.

In dummy word line driver 30, inverter 16 inverts selection signal DSE0 supplied to it. The output signal of inverter 16 is supplied to the gate of P-channel MOS transistor 14. Selection signal DSE0 is also supplied of the gate of MOS transistor 15 and to the first input of NAND gate 17. Equalizing signal EQL is input to inverter 18, the output of which is supplied to the second input of NAND gate 17. The output of NAND gate 17 is supplied to the gates of MOS transistors 11, 12, and 13.

Dummy word line driver 40 is identical to dummy word line driver 30 in structure, as can be understood from FIG. 5. Circuit 40 is also identical to circuit 30 in operation, except that selection signal DSE1, not DSE0, is supplied to inverter 16 and MOS transistor 15.

The dynamic memory has decoder 50 for generating selection signals DSE0 and DSE1 which are to be supplied to dummy word line drivers 30 and 40, respectively. Decoder 50 sets either signal DSE0 or signal DSE1 at logic "1" level in accordance with the same row-address signal as is supplied to row decoder RD.

All transistors used in either dummy word line driver, except for P-channel MOS transistor 14, are of N-channel type. Potential $V_{BL}$ can be obtained from the $V_{CC}$ source in, for example, an intermediate potential-generating circuit (not shown).

Figure 6:
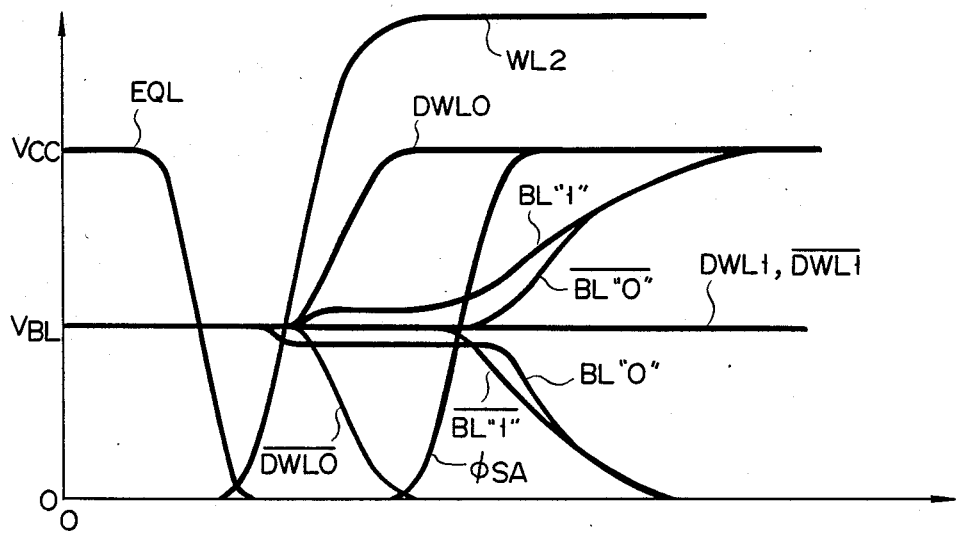
FIG. 6 is a diagram showing how the potentials of the various lines used in the dynamic memory shown in FIG. 5 change with time.

The operation of the dynamic memory described above will now be explained with reference to FIG. 6 which shows how the potentials of the various lines used in the memory change with time.

In the precharging period, equalizing signal EQL is set at the logic "1" level, or the $V_{CC}$ level. Hence, MOS transistors QE and QP connected to bit lines BLi and $\overline{\text{BLi}}$ of each pair, respectively, are turned on, thus precharging bit lines BLi and $\overline{\text{BLi}}$ to the $V_{BL}$ potential, that is, setting these bit lines at the same potential. Both selection signals DSE0 and DSE1 are at the logic "0" level at this time, and MOS transistors 14 and 15 incorporated in each dummy word line driver are off. Since signal EQL has been set at the logic "1" level, the output of inverter 18 used in each dummy word line driver is at the logic "0" level, whereby NAND gate 17 outputs a signal at the logic "1" level. As a result, MOS transistors 11, 12, and 13 provided in each dummy word line driver are turned on, and dummy word lines DWL0, $\overline{\text{DWL0}}$, DWL1, and $\overline{\text{DWL1}}$ are set to the $V_{BL}$ potential.

In the data-reading period, equalizing signal EQL, which has been at the logic "1" level during the precharging period, is set at the logic "0" level. As a result of this, MOS transistors QE and QP coupled to bit lines BL and $\overline{\text{BL}}$ of each pair, respectively, are turned off, thus disconnecting each pair of bit lines from the $V_{BL}$ potential source. Since signal EQL has been set to the logic "0" level, the output of inverter 18 provided in each dummy word line driver is set to the logic "1" level. Nonetheless, MOS transistors 11, 12, and 13 incorporated in each dummy word line driver remain on since both selection signals DSE0 and DSE1 are still at the logic "0" level. Therefore, dummy word lines DWL0, $\overline{\text{DWL0}}$, DWL1, and $\overline{\text{DWL1}}$ remain at the $V_{BL}$ potential.

Thereafter, the row-address signal is changed. In accordance with the row-address signal, decoder 50 sets either signal DSE0 or signal DSE1 at the logic "1" level. Assuming that signal DSE0 is set at the logic "1" level, MOS transistors 14 and 15 used in dummy word line driver 30 are turned on. In driver 30, the output of inverter 18 of driver 30 is at the logic "1" level, and the output of NAND gate 17 therefore falls to the logic "0" level. Hence, MOS transistors 11, 12, and 13, which are used in driver 30, are turned off. Dummy word line DWL0 is charged by MOS transistor 14, from the $V_{BL}$ potential to the $V_{CC}$ potential; dummy word line $\overline{\text{DWL0}}$ is discharged by MOS transistor 15, from the $V_{BL}$ potential to the $V_{SS}$ potential. As a result of this, such a reference potential Vref as has been described is generated in bit line $\overline{\text{BL}}$ of any pair. The charging of line DWL0 and the discharging of line $\overline{\text{DWL0}}$ are achieved by means of capacitors $C_D01$, $C_D21$, ... $C_D0m$, and $C_D2m$.

Assuming that row decoder RD selects one word line, for example, word line WL2, in accordance with the row address signal, the potential of word line WL2 rises from the $V_{SS}$ level to the $3/2\ V_{CC}$ level. Hence, data is read from the memory cells connected to this word line WL2 and bit lines BL of all pairs. More precisely, the potential representing the data is generated in these bit lines BL, and the reference potential Vref is generated in the bit lines $\overline{\text{BL}}$ forming pairs jointly with the bit lines $\overline{\text{BL}}$.

Thereafter, when control signal $\phi$SA rises to the logic "1" level, sense amplifiers SA1 to SAm are enabled to detect data. Dummy word lines DWL1 and $\overline{\text{DWL1}}$ coupled by capacitors $C_D11$, $C_D31$, ... $C_D1m$, and $C_D3m$ to bit lines BL, which are connected to the selected memory cells, remain at the $V_{BL}$-level potential. Signal DSE1 therefore remains at the logic "0" level. Hence, in dummy word line driver 40, the output of NAND gate 17 remains at the logic "1" level even if equalizing signal EQL falls to the logic "0" level, thus raising the output of inverter 18 to the logic "1" level. MOS transistors 11, 12, and 13 incorporated in driver 40 remain on, and dummy word lines DWL1 and $\overline{\text{DWL1}}$ stay at the $V_{BL}$-level potential. Neither line $\overline{\text{DWL1}}$ nor line DWL1 is in the floating state as in the conventional dynamic memory (FIG. 2). The potential of all bit lines BL, to which the selected memory cells are connected, is not adversely influenced by the potentials of dummy word lines DWL1 and $\overline{\text{DWL1}}$. As a result, sense amplifiers SA1 to SAm can detect the data with sufficient accuracy. Hence, the dynamic memory is greatly reliable.

Decoder 50 is designed, by means of a specific combination of logic elements, to set selection signal DSE1 at the logic "1", thereby selecting dummy word line driver 40, when the row-address signal changes in such a way that row decoder RD drives the odd-numbered word lines WL1, WL3, ... WLn. Decoder 50 is also designed and to set selection signal DSE0 at the logic "1", thereby selecting dummy word line driver 30, when the row-address signal changes in such a way that row decoder RD drives the even-numbered word lines WL2, WL4, ... WLn-1.

FIG. 7 shows another dynamic memory according to the present invention, This memory is different from the memory described above, in that dummy word line drivers 60 and 70 are used in place of drivers 30 and 40, both shown in FIG. 5. Each dummy word line driver differs from its counterpart shown in FIG. 5, in that two N-channel MOS transistors 19 and 20 replace inverter 18 and NAND gate 17.

In dummy word line driver 60, N-channel MOS transistor 19 is connected between dummy word line DWL0 and a $V_{BL}$ potential source, N-channel MOS transistor 20 is coupled between dummy word line $\overline{DWL0}$ and the $V_{BL}$ potential source, and the output of inverter 16 is supplied to the gate of both N-channel MOS transistors 19 and 20. Similarly, in dummy word line driver 70, N-channel MOS transistor 19 is connected between dummy word line DWL1 and the $V_{BL}$ potential source, N-channel MOS transistor 20 is coupled between dummy word line $\overline{DWL1}$ and the $V_{BL}$ potential source, and the output of inverter 16 is supplied to the gate of both N-channel MOS transistors 19 and 20.

In operation, when equalizing signal EQL falls from the logic "1" level to the logic "0" level, transistors 11, 12, and 13 used in each dummy word line driver are turned off. When both selection signals DSE0 and DSE1 are at the logic "0" level, the output of inverter 16 of each dummy word line driver is at the logic "1" level. Thus, MOS transistors 19 and 20 of each dummy word line driver remain on, and dummy word lies DWL0, $\overline{DWL0}$, DWL1, and $\overline{DWL1}$ are set at the $V_{BL}$ potential. Assuming that selection signal DSE0 rises from the logic "0" level to the logic "1" in this condition, MOS transistors 14 and 15 provided in driver 60 are turned on. Dummy word line DWL0 is therefore charged by transistor 14 of driver 60 from the $V_{BL}$ potential to the $V_{CC}$ potential, whereas dummy word line $\overline{DWL0}$ is discharged by transistor 15 from the $V_{BL}$ potential to the $V_{SS}$ potential. Since selection signal DSE1 remains at the logic "0" level, MOS transistors 19 and 20 used in driver 70 are still on, and the potentials of dummy word lines DWL1 and $\overline{DWL1}$ remain at the $V_{BL}$ level.

The present invention has been described with reference to the embodiments. Nonetheless, the invention is not limited to these embodiments. Various changes and modifications can be made without departing from the scope of the invention. For instance, this invention can also apply not only to CMOS dynamic memories (the above embodiments), each comprising P-channel MOS transistors and N-channel MOS transistors, but also to a dynamic memory comprising either P-channel MOS transistors or N-channel MOS transistors. The $V_{BL}$ potential source for precharging the bit lines is not limited to an intermediate potential-generating circuit, and can be an external power source.

What is claimed is:

1. A dynamic memory comprising:
   pairs of bit lines;
   a plurality of memory cells connected to each pair of bit lines;
   a plurality of word lines for selecting the memory cells;
   a precharging potential source for precharging said pairs of bit lines during a precharging period which precedes a data-reading period;
   a high-potential source; and
   a low-potential source;
   a plurality of sense amplifiers, each connected between a pair of bit lines, for detecting data during the data-reading period from a potential difference between the pair of bit lines;
   a first pair of dummy word lines;
   a second pair of dummy word lines;
   first capacitors, each connected between said first pair of dummy word lines, on the one hand, and the first of the corresponding pair of bit lines, on the other hand, for generating a reference potential;
   second capacitors, each connected between said second pair of dummy word lines, on the one hand, and the second of the corresponding pair of bit lines, on the other hand, for generating a reference potential;
   a first dummy word line driving circuit connected to said first pair of dummy word lines, for generating the reference potential in the first of each pair of bit lines;
   a second dummy word line driving circuit connected to said second pair of dummy word lines, for generating the reference potential in the second of each pair of bit lines; and
   a selection circuit for selecting either said first dummy word line driving circuit or said second dummy word line driving circuit,
   wherein during said precharging period, said first and second dummy word line driving circuits set said first and second pairs of dummy word lines at the potential of said precharging potential source, and during said data-reading period, the dummy word line driving circuit selected by said selection circuit sets the pair of dummy word lines at the potential of said high-potential source and the potential of said low-potential source, respectively, and the dummy word line driving circuit not selected by said selection circuit sets the pair of dummy word lines at the potential of said precharging potential source.

2. The dynamic memory according to claim 1, wherein said first capacitors and said second capacitors have the same capacitance.

3. The dynamic memory according to claim 1, wherein said selection circuit selects either said first dummy word line driving circuit or said second dummy word line driving circuit, in accordance with an address signal for driving said word lines.

4. The dynamic memory according to claim 1, wherein each of said dummy word line driving circuits comprises:
   first and second switching means connected between said pair of dummy word lines and said precharging potential source;
   third switching means connected between the first of said pair of dummy word lines and said high-potential source, said third switching means being turned on during said data-reading period;
   fourth switching means connected between the second of said pair of dummy word lines and said low-potential source, said fourth switching means being turned on during said data-reading period when selected by said selection circuit; and
   control means connected to receive a precharge control signal and an output signal of said selection circuit, for turning on said third and fourth switching means during said precharging period, and for turning on said first and second switching means during said data-reading period when selected by said selection circuit.

5. The dynamic memory according to claim 4, wherein said first to fourth switching means are MOS transistors.

6. The dynamic memory according to claim 4, wherein said control means comprises a gate circuit connected to receive said precharge control signal and the output of said selection circuit.

7. The dynamic memory according to claim 4, wherein each of said dummy word line driving circuits comprises:
first and second switching means connected between said pair of dummy word lines and said precharging potential source;
third switching means connected between the first of said pair of dummy word lines and said high-potential source, said third switching means being controlled by an output signal of said selection circuit;
fourth switching means connected between the second of said pair of dummy word lines and said low-potential source, said fourth switching means being controlled by the output of said selection circuit;
fifth switching means connected between the first of said pair of dummy word lines and said precharging potential source, said fifth switching means being controlled by an output signal of said selection circuit; and
sixth switching means connected between the second of said pair of dummy word lines and said precharging potential source, said sixth switching means being controlled by the output of said selection circuit.

8. The dynamic memory according to claim 7, wherein said first to sixth switching means are MOS transistors.

9. The dynamic memory according to claim 4, wherein each of said first and second dummy word line driving circuits further comprises switching means connected between the pair of dummy word lines, for supplying an equalizing signal under the control of said precharge control signal.

10. The dynamic memory according to claim 7, wherein each of said first and second dummy word line driving circuits further comprises switching means connected between the pair of dummy word lines, for supplying an equalizing signal under the control of said precharge control signal.

11. The dynamic memory according to claim 1, further comprising a plurality of switching means, each connected between the pair of bit lines, for supplying an equalizing signal under the control of said precharge control signal.

12. A dynamic memory comprising:
pairs of bit lines;
a plurality of memory cells connected to each pair of bit lines;
a plurality of word lines for selecting the memory cells;
a precharging potential source for precharging said pairs of bit lines during a precharging period which precedes a data-reading period;
a high-potential source; and
a low-potential source;
a plurality of sense amplifiers, each connected between a pair of bit lines, for detecting data during the data-reading period from a potential difference between the pair of bit lines;
a first pair of dummy word lines;
a second pair of dummy word lines;
first capacitors, each connected between said first pair of dummy word lines, on the one hand, and the first of the corresponding pair of bit lines, on the other hand, for generating a reference potential;
second capacitors, each connected between said second pair of dummy word lines, on the one hand, and the second of the corresponding pair of bit lines, on the other hand, for generating a reference potential;
a first dummy word line driving circuit connected to said first pair of dummy word lines, for generating the reference potential in the first of each pair of bit lines;
a second dummy word line driving circuit connected to said second pair of dummy word lines, for generating the reference potential in the second of each pair of bit lines; and
a selection circuit for selecting either said first dummy word line driving circuit or said second dummy word line driving circuit,
wherein each of said dummy word line driving circuits comprises:
first MOS transistor connected between the first of the pair of dummy word lines and said precharging potential source;
second MOS transistor connected between the second of the pair of dummy word lines and said precharging potential source;
third MOS transistor connected between the first of the pair of dummy word lines and said high-potential source, said third MOS transistor being turned on during said data-reading period when selected by said selection circuit;
fourth MOS transistor connected between the second of said pair of dummy word lines and said low-potential source, said fourth MOS transistor being turned on during said data-reading period when selected by said selection circuit; and
a gate circuit connected to receive a precharge control signal and an output signal of said selection circuit, for turning on said first and second MOS transistors during said precharging period, and for turning on said third and fourth MOS transistors during said data-reading period when said selection circuit outputs no signals.

13. The dynamic memory according to claim 12, wherein said first capacitors and said second capacitors have the same capacitance.

14. The dynamic memory according to claim 12, wherein said selection circuit selects either said first dummy word line driving circuit or said second dummy word line driving circuit, in accordance with an address signal for driving said word lines.

15. A dynamic memory comprising:
a plurality of pairs of bit lines;
a plurality of memory cells connected to each pair of bit lines;
a plurality of word lines for selecting the memory cells;
a plurality of potential source for precharging said pairs of bit lines during a precharging period which precedes a data-reading period;
a high-potential source;
a low-potential source;

a plurality of sense amplifiers, each connected between a pair of bit lines, for detecting data during the data-reading period from a potential difference between the pair of bit lines;
a first pair of dummy word lines;
a second pair of dummy word lines;
first capacitors, each connected between said first pair of dummy word lines and the first pair of the corresponding pair of bit lines, for generating a reference potential;
second capacitors, each connected between said first second pair of dummy word lines and the second of the corresponding pair of bit lines, for generating a reference potential;
a first dummy word line driving circuit connected to said first pair of dummy word lines for generating the reference potential in the first of each pair of bit lines;
a second dummy word line driving circuit connected to said second pair of dummy word lines, for generating the reference potential in the second of each pair of bit lines; and
a selection circuit for selecting either said first dummy word line driving circuit or said second dummy word line driving circuit,
wherein each of said dummy word line driving circuits comprises:
a first MOS transistor connected between the first of the pair of dummy word lines and said precharging potential source, said first MOS transistor being controlled by a precharge control signal;
a second MOS transistor connected between the second of the pair of dummy word lines and said precharging potential source, said second MOS transistor being controlled by a precharge control signal;
a third MOS transistor connected between the pair of dummy word lines, said third MOS transistor being controlled by the precharge control signal;
a fourth MOS transistor Connected between the first of the pair of dummy word lines and said high-potential source, said fourth MOS transistor being controlled by an output of said selection circuit;
a fifth MOS transistor connected between the second of said pair of dummy word lines and said low-potential source, said fifth MOS transistor being controlled by an output of said selection circuit;
a sixth MOS transistor connected between the first of said pair of dummy word lines and said precharging potential source, said sixth MOS transistor being controlled by an output of said selection circuit; and
a seventh MOS transistor connected between the second of said pair of dummy word lines and said precharging potential source, said seventh MOS transistor being controlled by an output of said selection circuit.

16. The dynamic memory according to claim 15, wherein said first capacitors and said second capacitors have the same capacitance.

17. The dynamic memory according to claim 15, wherein said selection circuit selects either said first dummy word line driving circuit or said second dummy word line driving circuit in accordance with an address signal used for driving said word lines.

* * * * *

UNITED STATES PATENT AND TRADEMARK OFFICE
CERTIFICATE OF CORRECTION

PATENT NO. : 4,907,200
DATED : March 6, 1990
INVENTOR(S) : Tatsuo Ikawa, et al.

It is certified that error appears in the above-identified patent and that said Letters Patent is hereby corrected as shown below:

On the title page: Abstract, item (57) line 24, "selected" should be preceded by --not--.

Claim 1, Col. 9, Line 67, delete "and";

Claim 12, Col. 11, Line 65, delete "and";

Claim 15, Col. 12, Line 64, "plurality of" should be --precharging--;

Claim 15, Col. 14, Line 7, "Connected" should be --connected--.

Signed and Sealed this

Twelfth Day of May, 1992

Attest:

DOUGLAS B. COMER

*Attesting Officer*  *Acting Commissioner of Patents and Trademarks*